(12) United States Patent
Hoisington

(10) Patent No.: US 6,620,237 B2
(45) Date of Patent: Sep. 16, 2003

(54) ORIENTED PIEZOELECTRIC FILM

(75) Inventor: Paul A. Hoisington, Norwich, VT (US)

(73) Assignee: Spectra, Inc., Lebanon, NH (US)

( * ) Notice: Subject to any disclaimer, the term of this patent is extended or adjusted under 35 U.S.C. 154(b) by 0 days.

(21) Appl. No.: 09/987,702

(22) Filed: Nov. 15, 2001

(65) Prior Publication Data

US 2003/0089303 A1 May 15, 2003

(51) Int. Cl.[7] .................. C30B 25/02; C30B 25/04
(52) U.S. Cl. ...................................................... 117/68
(58) Field of Search .................. 438/689; 117/84, 117/68

(56) References Cited

U.S. PATENT DOCUMENTS

| | | |
|---|---|---|
| 5,265,315 A | 11/1993 | Hoisington et al. |
| 5,446,484 A | 8/1995 | Hoisington et al. |
| 5,500,988 A | 3/1996 | Moynihan et al. |
| 5,691,752 A | 11/1997 | Moynihan et al. |
| 5,814,923 A | 9/1998 | Shimada |
| 5,825,121 A | 10/1998 | Shimada |
| 6,013,970 A | 1/2000 | Nishiwaki et al. |
| 6,051,057 A | 4/2000 | Yatake et al. |
| 6,051,914 A | 4/2000 | Nishiwaki |
| 6,097,133 A | 8/2000 | Shimada et al. |
| 6,103,072 A | 8/2000 | Nishiwaki et al. |
| 6,140,746 A | 10/2000 | Miyashita et al. |
| 6,147,438 A | 11/2000 | Nishiwaki et al. |
| 6,149,968 A | 11/2000 | Shimada |
| 6,194,818 B1 | 2/2001 | Sumi et al. |

OTHER PUBLICATIONS

Crystal Associates, Inc., Product Information Material, http://www.crystalassociates.com/piezo.html, 1999.
Guanghua Yi et al., "Preparation of Pb(Zr, Ti)O$_3$ Thin Films by Sol Gel Processing: Electrical, Optical, and Electro–Optic Properties," Journal of Applied Physics, vol. 64, No. 5, pp. 2717–2724 (1998).
Kelly McNeal et al., "Processing and Application of Solid State Converted Heterostructures," SPIE Conference on Smart Materials Technology, Newport Beach, SPIE vol. 3675, pp. 330–335 (Mar. 1999).

*Primary Examiner*—Felisa Hiteshew
(74) *Attorney, Agent, or Firm*—Fish & Richardson P.C.

(57) ABSTRACT

A piezoelectric device can be prepared by placing an acicular seed crystal on a substrate, orienting the seed crystal on the substrate, and growing a piezoelectric film from the acicular seed crystal.

30 Claims, 1 Drawing Sheet

ORIENTED PIEZOELECTRIC FILM

TECHNICAL FIELD

This invention relates to a piezoelectric device.

BACKGROUND

Piezoelectric films can find extensive use in applications such as ink jet printing modules and surface acoustic devices. Piezoelectric films in ink jet printing modules can be capable of a large deflection when a voltage is applied. Applying a voltage can change the shape of the piezoelectric film in a jetting region of the print module, subjecting ink in the module to jetting pressure. Consequently, the jetting pressure can eject the ink from a pumping chamber and can deposit the ink on a medium. Piezoelectric films can be composed of lead zirconium titanate ("PZT"). Piezoelectric films can be formed by methods including, for example, physical vapor deposition techniques such as sputtering, chemical vapor deposition, or spin coating techniques such as a sol-gel method. Thicker piezoelectric films can be produced by increasing the time of deposition, by repeated deposition of individual films to build a thicker film, or by conventional bulk ceramic manufacturing methods.

SUMMARY

A piezoelectric film can be prepared from an acicular seed crystal oriented on a substrate. The film is grown from the acicular seed crystal. The piezoelectric film grown from the acicular seed crystal can have d-coefficients that are improved relative to films grown from a symmetric seed crystal or a non-oriented seed crystal.

A seed crystal is a crystalline material that nucleates growth of a bulk crystal or crystalline film. An acicular seed crystal is a non-spherical crystal.

In one aspect, a method for manufacturing a piezoelectric device includes placing an acicular seed crystal onto a substrate, orienting the acicular seed crystal on the substrate, and growing a piezoelectric film from the acicular seed crystal. The seed crystal can be placed onto the substrate by depositing the seed crystal onto the substrate. The seed crystal can be oriented by inducing a flow of a precursor including the seed crystal on the substrate. The inducing of the flow of a precursor includes spin-coating or dip-coating the precursor on the substrate. The precursor can be a sol. Orienting the seed crystal includes spin-coating a sol on the substrate. The growing of the piezoelectric film includes forming a gel.

The acicular seed crystal can be a single crystal. The acicular seed crystal can have a length substantially parallel to the surface of the substrate. The seed crystal has an aspect ratio is greater than 1.5:1, greater than 2:1, or greater than 2.4:1. The acicular seed crystal can be a platelet. The method can further include placing a second acicular seed crystal onto a substrate, orienting the second seed crystal on the substrate, and growing a piezoelectric film from the second acicular seed crystal.

The piezoelectric film in the ink jet printing module can have a thickness in the range from about 0.1 to 25 microns, in the range from 0.5 to 10 microns, or from 0.1 to 5 microns. The piezoelectric film can be poled or annealed. The film can include lead zirconium titanate.

In another aspect, an ink jet printing module includes a substrate and a piezoelectric film on the substrate, the film including a plurality of acicular seed crystal oriented in substantially the same direction on the substrate. Each seed crystal can have a length substantially parallel to a surface of the substrate. The substrate can be silicon. The ink jet printing module includes an ink channel and electrical contacts arranged for activation of the piezoelectric film. The piezoelectric film is positioned to fill the channel with ink and subject the ink to jetting pressures during activation.

In another aspect, a method of manufacturing an ink jet printing module includes depositing a seed crystal in proximity to a surface, arranging the seed crystal so that the length is substantially parallel to the surface, and growing a piezoelectric film from the seed crystal. When in proximity to a surface, the seed crystal can contact or nearly contact the surface. The crystal has a length, a thickness and an aspect ratio greater than 1.1:1. The surface is a portion of the substrate. The seed crystal can be arranged so that the length is substantially parallel to the surface which includes a flow of a precursor including the seed crystal on the surface. The seed crystal can be arranged by inducing a flow of precursor including the seed crystal, for example, by spin-coating or dip-coating. The precursor can be a sol. In the method, inducing the flow of the precursor can include spin-coating of the sol.

Details are set forth in the accompanying drawings and the description below. Other features and advantages will be apparent from the description and drawings, and from the claims.

DETAILED DESCRIPTION

Figure 1:
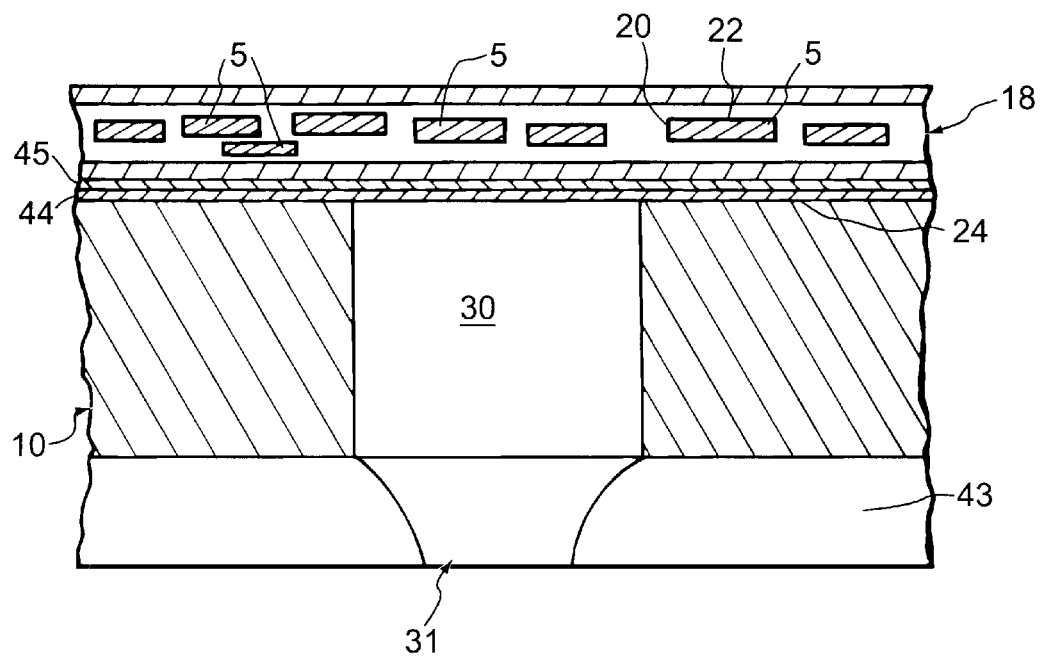
FIG. 1 is a drawing depicting a schematic view of a piezoelectric film including an acicular seed crystal.

The method for manufacturing a piezoelectric film can include placing an acicular seed crystal on a substrate and orienting the seed crystal. The oriented acicular seed crystal, which is ultimately incorporated into the piezoelectric film, nucleates the growth of the crystalline regions, which grow to form the piezoelectric film. For thicker piezoelectric films, the time of deposition can be increased or the film formation process can be repeated until the desired film thickness is achieved.

Referring to FIG. 1, a piezoelectric film 18 includes an acicular seed crystal 5 deposited on a substrate 10. The film is prepared by placing an acicular seed crystal on the substrate, orienting the acicular seed crystal on the substrate and growing a piezoelectric film from the seed crystal. A seed crystal is a crystalline material that nucleates the growth of a bulk crystal or crystalline film. The acicular seed crystal can be a single crystal. The seed crystal can be a ternary composition, such as, for example, lead zirconate and lead titanate, or a quaternary composition, such as, for example, lead zirconium titanate or lead magnesium niobate.

An acicular seed crystal is a non-spherical crystal to facilitate orienting the crystal. The dimensions of the acicular seed crystal are such that the seed crystal has a length, a thickness and an aspect ratio, or ratio of the length to the thickness, of greater than 1.1:1. The aspect ratio can be greater than 1.5:1, greater than 2:1, or greater than 2.4:1. The length can be between 2 and 50 microns, or 3 and 25 microns. The thickness can be between 0.1 and 20 microns, or 0.5 and 10 microns. Seed crystals having higher aspect ratio can be more readily oriented during the film forming process. The acicular seed crystal can be a single crystal, such as those commercially available from Crystal Associates (East Hanover, N.J. USA). A suitable seed crystal for preparing a piezoelectric film can be, for example, a lead magnesium niobate-lead titanate (PMN-PT) crystal having an aspect ratio of 2.5:1. Under certain circumstances, the acicular seed crystal can be a platelet having a width, a thickness and a length and an aspect ratio of the length to the thickness of greater than 1.5:1 and an aspect ratio of the width to the thickness of greater than 1.5:1.

The acicular seed crystal can be oriented by a flow of a precursor. The precursor is a carrier for the seed crystal that can be thermally or chemically altered to form the piezoelectric film. Referring to FIG. 1, the acicular seed crystal 5 used to nucleate growth of the film has a thickness 20 and a length 22 substantially aligned with a surface 24 of the substrate 10. The flow of the precursor aligns the acicular seed crystal such that the length of the acicular seed crystal is substantially parallel to the flow of the precursor. Alignment of the acicular seed crystal occurs, in part, because flow rotates the crystal such that the length of the acicular seed crystal corresponds generally with the direction of the flow, leading to orientation of the acicular seed crystal.

Growth of the film can be nucleated by the oriented acicular seed crystal. Growth promoting species at the grain boundaries can be present during formation of the piezoelectric film. Seeding with a plurality of acicular seed crystals in the crystallization process of the piezoelectric film allows crystallization to occur at multiple sites within the piezoelectric film, thus extending the oriented structure throughout the matrix of the piezoelectric film. Because the acicular seed crystals are oriented, growth occurs in substantially the same crystallographic orientation relative to the surface of the substrate. The oriented acicular seed crystals allow for pseudo-epitaxial growth during crystallization by nucleating growth of film in a regular manner. As a result, in part, the piezoelectric performance of the film can approach that of a single crystal. Physical properties such as elasticity and deflection properties as measured by the d-coefficients of the piezoelectric film can be improved relative to films grown from symmetric seed crystals or non-oriented seed crystal.

The piezoelectric film can be composed of lead zirconium titanate (PZT). A thin film of lead zirconium titanate (PZT) piezoelectric can be applied on substrate by a sol gel process. The sol gel process can be modified from the process described, for example, in the publication entitled "Preparation of $Pb(ZrTi)O_3$ Thin Films by Sol Gel Processing: Electrical, Optical, and Electro-Optic Properties" by Yi et al., *Journal of Applied Physics*, 64(5): 2717–2724 (1988). The precursor compounds used to prepare the piezoelectric film can have high solubility in solvent, good compatibility with each other, and should readily be transformed to their corresponding metal oxides. Film forming conditions can be chosen to avoid any significant sublimation of the precursor compounds so that the ratio of the metals in the piezoelectric film remains unchanged from that of the precursor. For example, a PZT film can be formed from mixtures of lead acetate ($Pb(CH_3CO_2)_2 \cdot 3H_2O$), zirconium propoxide (Zr $(C_3H_7O)_4$) and titanium isopropoxide ($Ti((CH_3)_2CHO)_4$).

For example, during the process, a precursor such as a sol, can be prepared. For example, the sol can be prepared according to Table 1, which shows the chemical composition for the preparation of a sol for making a PZT film. In the preparation of the sol, lead acetate is dissolved in acetic acid in a ratio of 2 g of lead acetate to 1 mL of acetic acid followed by heating the solution to 105° C. to remove water. The dehydrated solution is then cooled to below 80° C. before zirconium propoxide and titanium isopropoxide are added in a stepwise manner. For example, zirconium propoxide can be added first followed by titanium isopropoxide. The mixture is agitated in an ultrasonic bath until all the condensed solid is dissolved. The mixture is diluted with distilled water or propanol to adjust the viscosity and surface tension of the sol. The sol is then filtered through a membrane filter and stored.

TABLE 1

| Composition | Mass |
|---|---|
| $Pb(CH_3CO_2)_2 \cdot 3H_2O$ | 12.0 g |
| $CH_3COOH$ | 6 mL |
| $Zr(C_3H_7O)_4$ | 5.54 g |
| $Ti((CH_3)_2CHO)_4$ | 2.18 g |
| $HOCH_2CH_2OH$ | 1.2 mL |
| $H_2O$ (distilled) | 6 mL |

The sol can be used to orient the seed crystal by spin coating or dip coating of the sol on the substrate. The film thickness can be varied by altering the concentration and viscosity of the compounds in the sol. The lower the concentration of compounds, the smoother the film. The piezoelectric film can have a thickness of 0.1 to 5 microns, depending upon the concentration and viscosity of the compounds used in the PZT film. Additives such as ethylene glycol can be included to prevent cracking and to improve surface smoothness of the film.

The substrate can be silicon. Silicon can be a suitable substrate for thin-film deposition and photoresist processes which can facilitate the manufacture of the device containing the piezoelectric film. A silicon substrate can have the mechanical, electrical and thermal properties needed for use as an ink chamber plate in an ink jet head. Silicon can also permit incorporation of suitable system control components on the same substrate by, for example, integrated circuit fabrication techniques. An acicular seed crystal or a plurality of acicular seed crystals is dispersed in the final sol. The sol can include 10–90%, or 15–30% by weight seed crystals. The final sol containing the seed crystals is applied to a substrate which is mounted on a spinner. The flow of the sol during spinning can orient the seed crystal by creating a radially outward flow such that the acicular seed crystal aligns with the radially outward flow, such that the length of the crystal is oriented substantially parallel to the surface of the substrate. A Headway Research Incorporated photoresist spinner, operating at 8500 rpm for 20 seconds can be used, for example, to spin the substrate. Similarly, the film can be prepared by dip-coating the substrate in a vat containing the sol. The substrate is drawn out of the vat at a controlled rate. Drawing the substrate from the vat creates a flow such that the acicular seed crystals align relative to the surface of the substrate.

After depositing the precursor, it is heated to transform the material into an inorganic ceramic film at temperatures between 400° C. and 600° C. During this process, solvent can evaporate, dehydration can occur and decomposition of compounds into metal oxides can also occur. The amorphous film can be annealed, which can densify the film. During annealing, the crystalline nature of the film can be established. The acicular seed crystals can influence growth of the crystal by allowing crystallization to occur epitaxially to form the crystalline film. The films can be annealed by heating it to 600° C. to 1000° C., which can further orient growth in the crystalline film. Rapid thermal annealing can be used to reduce the cycle time and to obtain a small uniform grain structure. The atmosphere can be controlled to maintain the stoichiometry of the composition. The coated substrate can be heated at a rate of about 100° C. per second to approximately 1000° C. and maintained at the temperature for about 19 seconds, before cooling the coated substrate to room temperature in about 30 seconds by inert gas circulation.

The piezoelectric film can be poled by application an electric field. A poling process is described, for example in U.S. Pat. No. 5,605,659, which is incorporated herein by reference in its entirety. The degree of poling can depend on the strength and duration of the applied electric field. When the poling voltage is removed the piezoelectric domains in the film are aligned. Because the film forms from oriented seed crystals, the domain alignment can increase relative to comparable unoriented films One example of a piezoelectric ink jet printing module is the module described in U.S. Pat. No. 5,265,315, the entire contents of which is incorporated herein by reference. Referring to FIG. 1, ink jet chamber with piezoelectric film 18 includes a substrate 10 having an orifice plate 43 affixed to the lower surface of the silicon substrate 10. An orifice 31 is present in each ink channel 30 of substrate 10. A thin metal barrier layer 44 of platinum, nickel or the like about 0.2 microns thick can be present on the upper surface of the substrate 10. The electrode pattern with electrical contacts arranged for activation of the piezoelectric film, in a layer 45, can be placed over the metal barrier layer 44. The piezoelectric film 18 can be applied on the electrode pattern layer 45.

A method of manufacturing the ink jet chamber with a piezoelectric includes affixing an orifice plate 43 to the lower surface of the silicon substrate 10. Next a layer of metal barrier 44, about 0.2 micron thick can be applied to the upper surface the substrate 10. The conductive layer may be a sputter or vacuum-evaporated aluminum, nickel, chromium or platinum layer. The electrode pattern 45 is etched by conventional photoresist methodology where a photoresist layer can be spin-coated on the conductive layer, which is then exposed to ultraviolet rays through a mask and developed to harden the resist layer in selected regions in accordance with an electrode pattern. The unhardened photoresist can be removed, the exposed metal layer can be etched followed by stripping the photoresist, leaving a conductive electrode pattern on the layer. Thereafter, the piezoelectric film 18 is applied to the upper surface of the electrode pattern 45 by the process describe above. Application of successive layers of piezoelectric material can be repeated to provide the required piezoelectric film thickness. A pattern of electrodes can be applied to the top surface of the piezoelectric thin film.

In order to jet ink from the ink chamber, a voltage is applied to the electrodes. Upon application of the voltage, the shape of the piezoelectric thin film changes in the jetting region of the print module, subjecting the ink in the ink channel to jetting pressure. Consequently, the jetting pressure can eject the ink from ink channel, through orifice and can deposit the ink on a medium. A typical process for preparing an ink jet head having ink chambers with a piezoelectric film is described, for example in U.S. Pat. No. 5,265,315, which is incorporated herein by reference in its entirety.

Other embodiments are within the scope of the following claims.

What is claimed is:

1. A method for manufacturing a piezoelectric film comprising:

placing an acicular seed crystal onto a substrate;

orienting the acicular seed crystal on the substrate; and growing a piezoelectric film from the seed crystal.

2. The method according to claim 1, wherein placing the seed crystal onto the substrate includes depositing the seed crystal onto the substrate from a sol.

3. The method according to claim 1, wherein orienting the seed crystal on the substrate includes inducing a flow of a precursor including the seed crystal on the substrate.

4. The method according to claim 3, wherein inducing the flow of the precursor on the substrate includes spin-coating or dip-coating the precursor on the substrate.

5. The method according to claim 3, wherein the precursor is a sol.

6. The method according to claim 3, wherein orienting the seed crystal includes spin-coating a sol on the substrate.

7. The method according to claim 1, wherein the acicular seed crystal is a single crystal.

8. The method according to claim 1, wherein growing of the piezoelectric film includes forming a gel.

9. The method according to claim 1, further comprising placing a second acicular seed crystal onto the substrate, orienting the second seed crystal on the substrate, and growing the piezoelectric film from the second seed crystal.

10. The method according to claim 1, wherein the piezoelectric film has a thickness of 0.1 to 25 microns.

11. The method according to claim 1, further comprising poling the piezoelectric film.

12. The method according to claim 1, further comprising annealing the piezoelectric film.

13. The method according to claim 1, wherein the piezoelectric film includes lead zirconium titanate.

14. The method according to claim 1, wherein the acicular seed crystal is a platelet.

15. A method of manufacturing an ink jet printing module comprising:

depositing a seed crystal in proximity to a surface, the seed crystal having a length, a thickness and an aspect ratio greater than 1.1:1;

arranging the seed crystal so that the length is substantially parallel to the surface; and growing a piezoelectric film from the seed crystal.

16. The method according to claim 15, wherein the surface is a portion of a substrate.

17. The method according to claim 15, wherein arranging the seed crystal so that the length is substantially parallel to the surface includes inducing a flow of a precursor including the seed crystal on the surface.

18. The method according to claim 17, wherein inducing the flow of the precursor includes spin-coating or dip-coating the precursor on the surface.

19. The method according to claim 18, wherein the precursor is a sol.

20. The method according to claim 19, wherein inducing the flow of the precursor includes spin-coating of the sol.

21. The method according to claim 15, wherein the aspect ratio is greater than 2:1.

22. An ink jet printing module comprising:

a substrate; and a piezoelectric film on the substrate, the film including a plurality of acicular seed crystals oriented in substantially the same direction on the substrate.

23. The ink jet printing module according to claim 22, wherein each seed crystal has a length substantially parallel to a surface of the substrate.

24. The ink jet printing module according to claim 22, wherein the seed crystal has an aspect ratio is greater than 1.5:1.

25. The ink jet printing module according to claim 24, wherein the aspect ratio is greater than 2:1.

26. The ink jet printing module according to claim 24, wherein the aspect ratio is greater than 2.4:1.

27. An ink jet module according to claim 22, wherein the piezoelectric film has a thickness in the range from 0.1 to 25 microns.

28. An ink jet module according to claim 22, wherein the piezoelectric film has a thickness of 0.5 to 10 microns.

29. An ink jet module according to claim 22, wherein the piezoelectric film has a thickness of 0.1 to 5 microns.

30. The method of claim 22, wherein the ink jet printing module includes an ink channel, electrical contacts arranged for activation of the piezoelectric film and the piezoelectric film positioned to subject ink within the channel to jetting pressure during activation.

* * * * *